(12) United States Patent
Su

(10) Patent No.: US 6,326,816 B1
(45) Date of Patent: Dec. 4, 2001

(54) METHOD AND APPARATUS FOR MINIMAL PHASE DELAY AND ZERO-CROSSING FILTERING

(75) Inventor: Chun-Neng Su, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 09/669,880

(22) Filed: Sep. 27, 2000

(30) Foreign Application Priority Data

Dec. 9, 1999 (TW) ............................................ 88121612 A

(51) Int. Cl.⁷ ...................................................... H03K 5/22
(52) U.S. Cl. ................................ 327/78; 327/79; 327/552
(58) Field of Search .................................... 327/552, 553, 327/555, 556, 557, 558, 559, 72, 77, 78, 79

(56) References Cited

U.S. PATENT DOCUMENTS 4,912,420 * 3/1990 Parnell .................................... 327/78
6,259,296 * 7/2001 Hatani ................................... 327/307

* cited by examiner

*Primary Examiner*—Kenneth B. Wells
*Assistant Examiner*—Paul Dinh
(74) *Attorney, Agent, or Firm*—Rabin & Berdo, P.C.

(57) ABSTRACT

An apparatus for minimal phase delay and zero crossing filtering, obtaining a filtered signal without phase delay and glitch by combining a zero crossing filter and a hysteresis zero crossing filter. The zero crossing filter and the hysteresis zero crossing filter both receive an input signal and a reference signal and respectively output a zero-delay signal with glitches and a hysteresis signal with phase delay. A phase-protect filter then receives these two signals and outputs the filtered signal. When the zero-delay signal has a change of state and the hysteresis signal is at the first state, the filtered signal is at the second state. When the zero-delay signal has a change of state and the hysteresis signal is at the second state, the filtered signal is at the first state. When the zero-delay signal has no change of state, the filtered signal remains unchanged.

17 Claims, 5 Drawing Sheets

METHOD AND APPARATUS FOR MINIMAL PHASE DELAY AND ZERO-CROSSING FILTERING

BACKGROUND OF THE INVENTION

This application incorporates by reference Taiwanese application Serial No. 88121612, filed on Dec. 9, 1999.

1. Field of the Invention

The invention relates in general to circuitry for minimal phase delay and zero crossing filtering and more particularly to circuitry for minimal phase delay and zero crossing filtering, which is used for high-speed glitch-free analog-to-digital signal conversion.

2. Description of the Related Art

Zero-crossing (ZC) filters are widely applied in circuit designs, such as the circuitry design for converting analog to digital signals.

Referring now to FIG. 1, it illustrates a conventional zero crossing filter having two inputs, an input signal $V_I$ and a reference voltage $V_{ref}$, and outputting an output signal $V_O'$. FIG. 2 depicts the transfer characteristic of the zero crossing filter in FIG. 1. FIG. 2 indicates that when $V_I$ becomes lower than $V_{ref}$, $V_O'$ changes from the high level state $L_1$ to the low level state $L_0$; otherwise, when $V_I$ becomes higher than $V_{ref}$, $V_O'$ changes from the low level state $L_0$ to the high level state $L_1$.

FIG. 3 contains the waveform diagrams of the input and output signals of the filter in FIG. 1. In the case of $V_{ref}$ of 0 voltage, the ideal output signal waveform of the filter is the signal $V_O$. In FIG. 3, there are four zero crossing points indicated by the intersections of the vertical dotted lines and the time axes. However, the input signal $V_I$ may be interfered with by some external high frequency noise, resulting in undesired glitches near the zero crossing points in the output signal waveform, such as the waveform of the output signal $V_O'$ shown in FIG. 3. The glitches negatively affect the quality of the output signal $V_O$, which will easily cause the circuitry for processing the output $V_O'$ to operate improperly.

For eliminating glitches, there are two conventional approaches. In the first approach a hysteresis zero crossing filter is applied. Referring now to FIG. 4, it illustrates a hysteresis zero crossing filter having two input signals, $V_I$ and $V_{ref}$, and an output signal $V_O$. FIG. 5 depicts the transfer characteristic of the hysteresis zero crossing filter in FIG. 4. According to FIG. 5, when $V_I$ exceeds the high threshold voltage $V_H$, output signal $V_O$ changes from the low level state $L_0$ to the high level state $L_1$; on the other hand, when $V_I$ becomes below the low threshold voltage $V_L$, $V_O$ changes from the high level state $L_1$ to the low level state $L_0$.

Referring to FIG. 6, it contains the waveform diagrams of the input and output signals of the hysteresis zero crossing filter. Because of the hysteresis of the filter, the output signal $V_O$ does not contain any glitch. However, due to the hysteresis, a phase delay of the output signal $V_O$ occurs.

Another approach to diminishing glitches is to cascade the zero crossing filter, in which glitches occur, with a digital logic circuitry for processing the output signal of the filter. The digital circuitry detects whether a glitch occurs on the output signal of the filter. If so, the circuitry temporarily stops sampling the output signal of the filter for a period of time, i.e. a response time delay, until the input signal $V_I$ is stable. Although, in this approach, glitches are reduced effectively, a phase delay of the output signal $V_O$ occurs also.

In systems having high-speed analog-to-digital signal conversion, phase delay in signals may affect the total performance of the systems. For instance, in a digital versatile disk (DVD) system, a servo control signal is used to control the actuator of the optical head for tracking and focusing. If the servo control signal has a phase delay, the response speed of the servo controller becomes slower such that the system fails to maintain the effective performance.

SUMMARY OF THE INVENTION

It is therefore an object of the invention to provide an apparatus and a method for minimal phase delay and zero crossing filtering. The filtering apparatus utilizes the characteristics of a phase delay filter, a hysteresis zero crossing filter and a phase protecting filter for obtaining an output signal with minimal phase delay and no glitch. The invention is suitable for systems that require no phase delay and glitch in the output of analog-to-digital signal conversion.

In accordance with the object of the invention, it provides an apparatus for minimal phase delay and zero crossing filtering, receiving both an input signal and a reference signal while outputting a filtered signal. The apparatus includes a zero crossing filter, a hysteresis zero crossing filter, and a phase-protect filter. The zero crossing filter generates a zero-delay signal in response to the input signal and the reference signal. The hysteresis zero crossing filter generates a hysteresis signal in response to the input signal and the reference signal. The phase-protect filter generates the filtered signal in response to the zero-delay signal and the hysteresis signal. The zero-delay signal, the hysteresis signal, and the filtered signal are switched between a first state and a second state. When the zero-delay signal has a change of state and the hysteresis signal is at the first state, the filtered signal is at the second state. When the zero-delay signal has a change of state and the hysteresis signal is at the second state, the filtered signal is at the first state. When the zero-delay signal has no change of state, the filtered signal remains unchanged.

In accordance with the object of the invention, it also provides a phase protect filter for receiving a zero-delay signal and a hysteresis signal and outputting a filtered signal. The phase protect filter includes a first register, an exclusive-OR circuit, a NAND circuit, multiplexer, and second register. The first register receives the zero-delay signal and a system clock signal and outputs a first signal. The exclusive-OR circuit receives the zero-delay signal and the first signal and outputs a second signal. The NAND circuit receives the hysteresis signal and the second signal and outputs a third signal. The multiplexer receives the second signal and the third signal and outputs a fourth signal. The second register receives the system clock signal and the fourth signal and outputs the filtered signal. The filtered signal is fed back to the multiplexer and the multiplexer selects either the filtered signal or the third signal as the fourth signal according to the second signal.

In accordance with the object of the invention, it also provides a method for minimal phase delay and zero crossing filtering, converting an input signal into a filtered signal. First, a zero-delay signal and a hysteresis signal are generated, wherein the zero-delay signal, hysteresis signal, and filtered signal are switched between a first state and a second state. The filtered signal is then outputted according to the zero-delay signal and the hysteresis signal. When the zero-delay signal has a change of state and the hysteresis signal is at the first state, the filtered signal is at the second state. When the zero-delay signal has a change of state and the hysteresis signal is at the second state, the filtered signal is at the first state. When the zero-delay signal has no change of state, the filtered signal's state remains unchanged.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
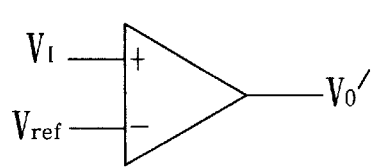
FIG. 1 (Prior Art) illustrates a conventional zero crossing filter.
Figure 2:
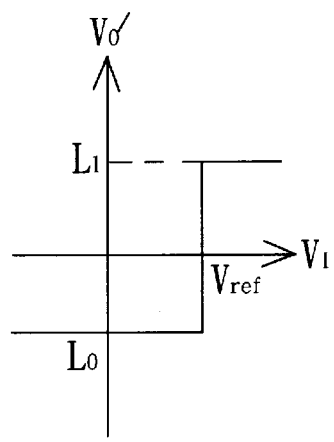
FIG. 2 (Prior Art) illustrates the transfer characteristic of the zero crossing filter in FIG. 1.
Figure 3:
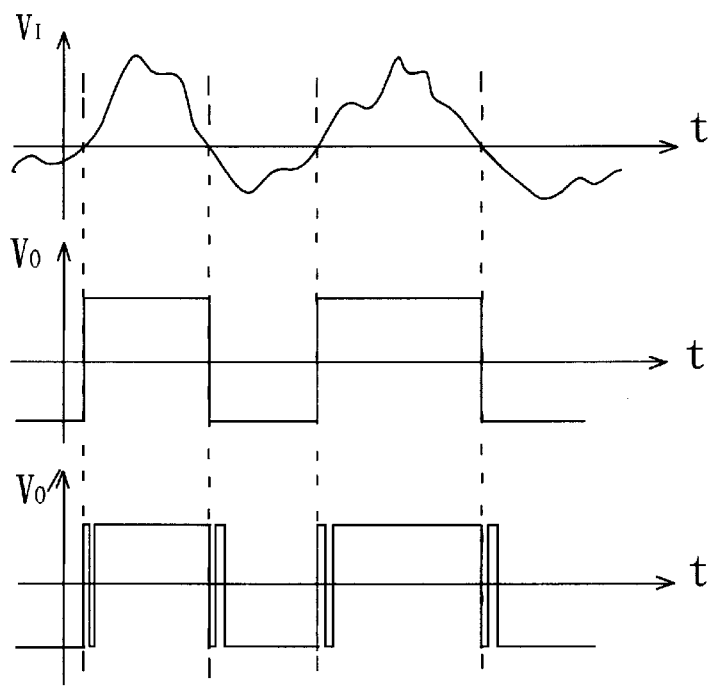
FIG. 3 (Prior Art) illustrates the waveform diagrams of the input and output signals of the filter in FIG. 1.
Figure 4:
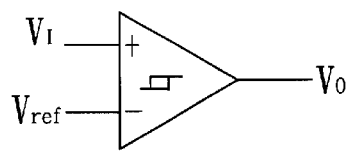
FIG. 4 (Prior Art) illustrates a hysteresis zero crossing filter.
Figure 5:
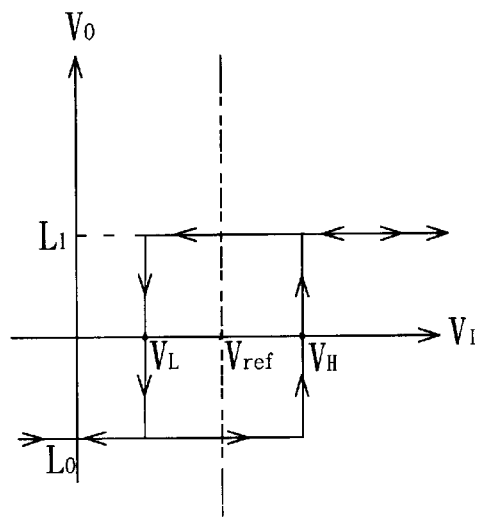
FIG. 5 (Prior Art) illustrates the transfer characteristic of the hysteresis zero crossing filter in FIG. 4.
Figure 6:
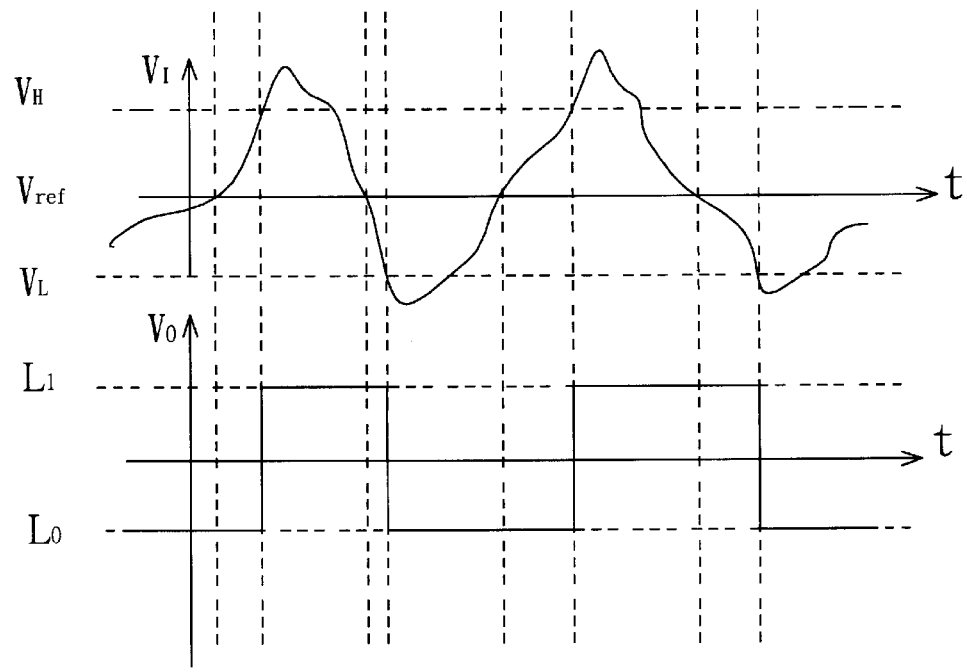
FIG. 6 (Prior Art) illustrates the waveform diagrams of the input and output signals of the hysteresis is zero crossing filter in FIG. 4.
Figure 7:
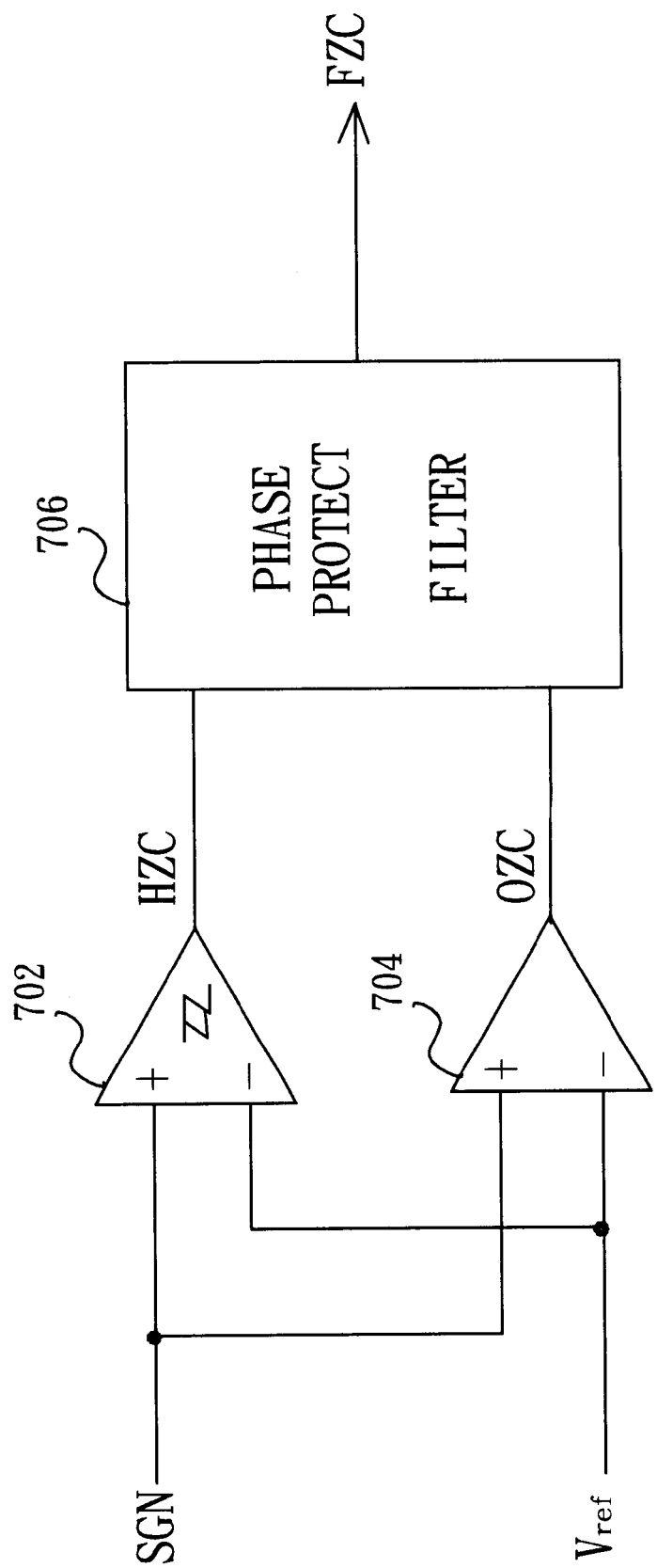
FIG. 7 illustrates a block diagram of the minimal delay zero crossing filter according to a preferred embodiment of the invention.

FIG. 7 illustrates the block diagram of the minimal delay zero crossing filter according to a preferred embodiment of the invention, showing that both the input signal SGN and the reference voltage $V_{ref}$ are received by the hysteresis zero crossing filter 702 as well as the zero crossing filter 704. The hysteresis zero crossing filter 702 outputs a hysteresis signal HZC while the zero crossing filter 704 outputs a zero-delay signal 0ZC. When the input signal SGN becomes higher than the high threshold voltage $V_H$, the hysteresis signal HZC changes to a high level state; when the input signal SGN becomes lower than the low threshold voltage $V_L$, the hysteresis signal HZC changes to a low level state. When the input signal SGN becomes higher than the reference voltage $V_{ref}$, the zero-delay signal 0ZC changes to the high level state; when the input signal SGN becomes lower than the reference voltage $V_{ref}$, the zero-delay signal 0ZC changes to the low level state.

The phase-protect filter 706 then receives the HZC and 0ZC signals and outputs a filtered signal FZC. According to the phase-protect filter 706, when the signal 0ZC has a change of state and the signal HZC is at the low level state, the filtered signal FZC changes to the high level state. On the other hand, when the signal 0ZC has a change of state and the signal HZC is at the high level state, the filtered signal FZC changes to the low level state. In this way, the resulting filtered signal FZC of the filtering apparatus is a digital signal without any phase delay and glitch.

Figure 8:
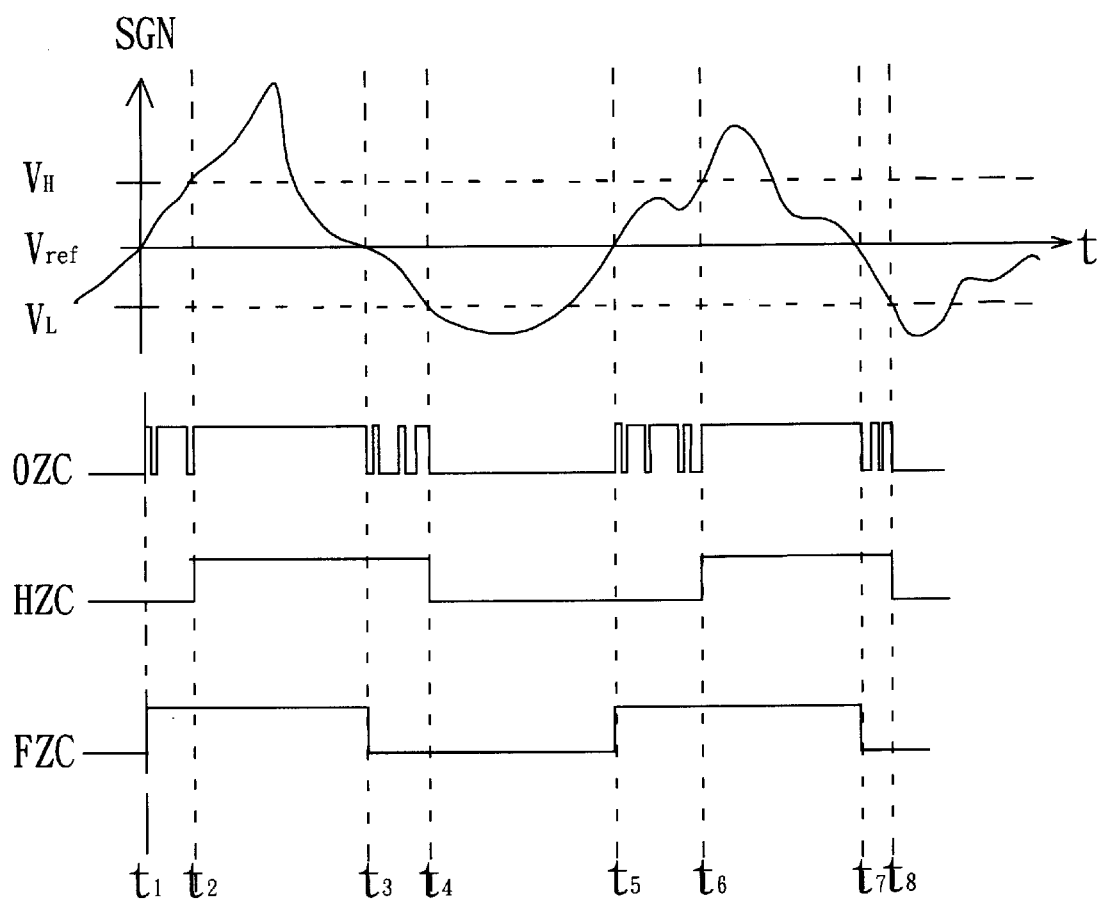
FIG. 8 illustrates the waveform diagrams of the signals of the minimal delay zero crossing filter in FIG. 7.

Referring to FIG. 8, it depicts the waveforms of the signals SGN, HZC, 0ZC and FZC of the minimal delay zero crossing filter in FIG. 7. As illustrated in FIG. 8, the signals HZC, 0ZC and FZC are all at the low level state before time $t_1$. At time $t_1$, the voltage of the signal SGN is higher than the reference voltage $V_{ref}$, resulting in the signal 0ZC changing to the high level state. Then, after a period of time, at time $t_2$, the signal HZC goes to the high level state when the voltage of the signal SGN becomes higher than the high threshold voltage $V_H$. During the period $t_1$ to $t_2$, although glitches occur on the signal 0ZC corresponding to numerous state transitions, the filtered signal FZC remains in the high level state because of the signal HZC being in the low level state.

During the period $t_2$ to $t_3$, the input signal SGN is still higher than the reference voltage $V_{ref}$ and thus the signals 0ZC and HZC remain in the high level state. During this period, the signal SGN is much higher than $V_{ref}$ so there are no glitches on the signal 0ZC, resulting in a more stable waveform without any change of state. Thus, the state of filtered signal FZC remains unchanged (i.e. in the high level state). At $t_3$, the voltage of the signal SGN becomes lower than the reference voltage $V_{ref}$, resulting in the signal 0ZC going to the low level state. Then, after a period of time, at time $t_4$, the signal HZC goes to the low level state when the voltage of the signal SGN becomes lower than the low threshold voltage $V_L$. During the period $t_3$ to $t_4$, the signal 0ZC has several state changes and the signal HZC is in the high level state, so that the filtered signal FZC switches to the low level state at time $t_3$ and remains unchanged for the time period.

During the period $t_4$ to $t_5$, since the signal SGN is lower than the reference voltage $V_{ref}$, the signals 0ZC and HZC remain in the low level state. For this period of time, since the signal 0ZC has no change of state, the filtered signal FZC remains unchanged in the low level state. After time $t_5$, according to the same principle as in the period $t_3$ to $t_4$, the filtered signal FZC is glitch-free also.

When the input signal SGN approaches the reference voltage $V_{ref}$, it is possible that glitches occur on the signal 0ZC due to external interference. When the input signal SGN much exceeds the reference voltage $V_{ref}$, the effect of the interference on the signal 0ZC is insignificant resulting in a very low probability of glitches occurring.

Time periods $t_1$ to $t_2$, $t_3$ to $t_4$, $t_5$ to $t_6$, and $t_7$ to $t_8$ are regarded as periods in which the output signal needs to be protected from glitches. These periods are termed "protect windows". As is evident, a protect window is an interval from the time when the zero-delay signal 0ZC begins to have state changes to the time when the hysteresis signal HZC begins to have state changes. Within a protect window, if glitches occur on the signal 0ZC, the filtered signal FZC is protected against glitch interference. The longer the time before the hysteresis signal HZC changes its state, the wider the protect window is.

Time periods $t_2$ to $t_3$, $t_4$ to $t_5$, and $t_6$ to $t_7$ are not protect windows, but, as mentioned above, the probability of the glitch occurrence is very low resulting in the filtered signal FZC being unaffected by the interference.

Figure 9:
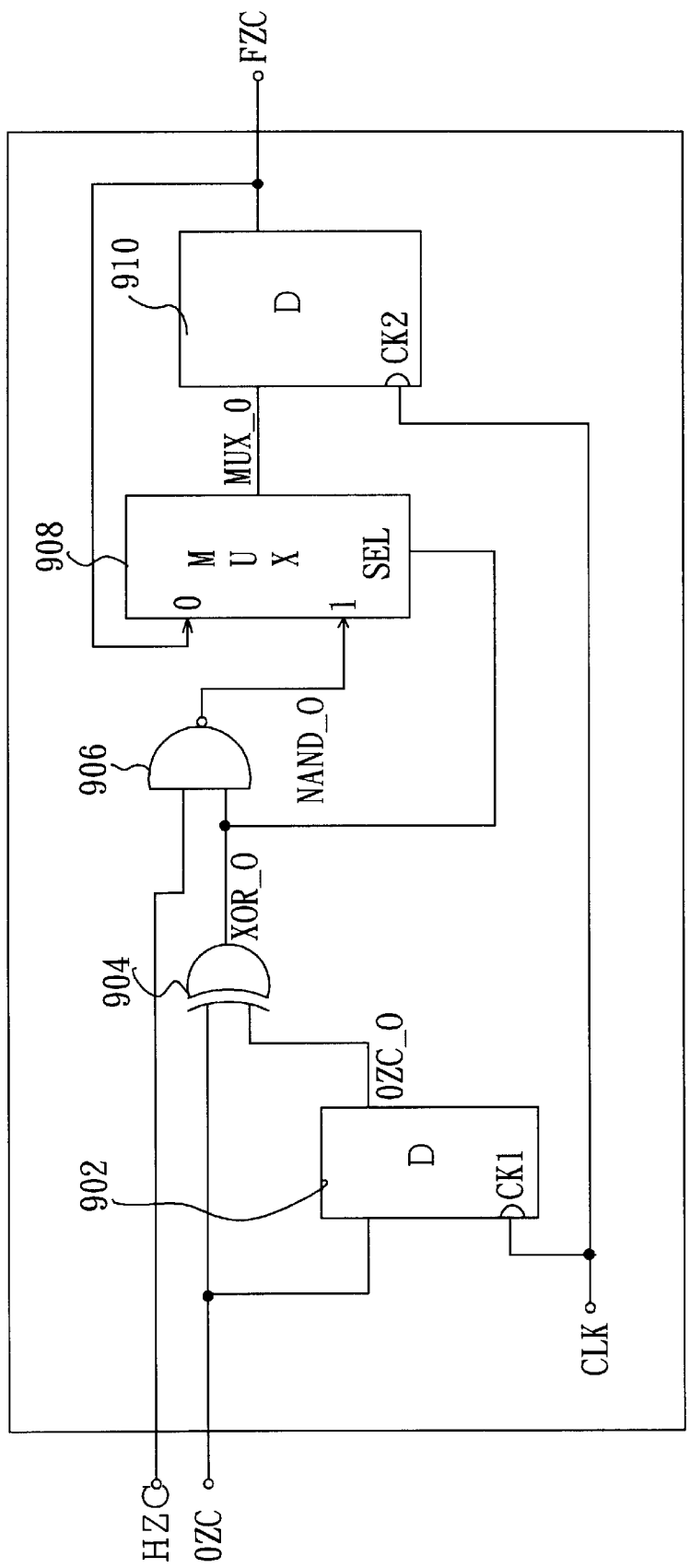
FIG. 9 illustrates a block diagram of the phase protecting filter in FIG. 7.

As for the phase-protect filter, it can be implemented in many approaches. One embodiment is illustrated in FIG. 9 showing the block diagram of the phase-protect filter. As shown in FIG. 9, the zero crossing signal 0ZC is inputted to a register 902 which then outputs a first signal 0ZC_O. In response to the first signal 0ZC_O and the signal 0ZC, an exclusive OR (XOR) gate 904 outputs a second signal XOR_O. The second signal XOR_O and the hysteresis signal HZC are inputted to a NAND gate 906 which outputs a third signal NAND_O. The third signal NAND_O is received by a multiplexer 908 at input 1 and the second signal XOR_O is the input to the multiplexer 908 at select input SEL. The multiplexer 908 outputs a fourth signal MUX_O as the input to a register 910. The register 910 outputs the filtered signal FZC which is fed back to the input 0 of the multiplexer 908. The system clock signal CLK is inputted to the clock input CK1 of the register 902 and the clock input CK2 of the register 910 respectively. The registers 902 and 910 can be implemented with standardized integrated circuits such as D flip-flops.

When the signal 0ZC has no any change of state, the signals 0ZC and 0ZC_O are of the same state such that the second signal XOR_O is at the low state. When the signal 0ZC has a change of state, the state of the signals 0ZC and 0ZC_O are opposite to each other such that the second signal XOR_O is at the high state. When the second signal XOR_O is at the low state, the multiplexer 908 selects the filtered signal FZC as its output. When the second signal XOR_O is at the high state, the multiplexer 908 selects the third signal NAND_O as its output. When the second signal XOR_O is at the high state and the hysteresis signal HZC is at the low state, the third signal NAND_O is at the high state. When the second signal XOR_O and the hysteresis signal HZC both are at the high state, the third ignal NAND_O is at the low state.

Referring now to both FIGS. 8 and 9, the principle of the phase-protect filter mentioned above are described as follows. Before time $t_1$, the signal 0ZC has no change of state. Thus, the second signal XOR_O is at the low state and the filtered signal FZC remains in the low state. During the period $t_1$ to $t_2$, the signal 0ZC has changes of state so that the second signal XOR_O is at the high state, and the multiplexer 908 accordingly selects the third signal NAND_O as its output. During this period, since the signal HZC is in the low level state, the third signal NAND_O is in the high state and the filtered signal FZC goes to the high level state also. During the period $t_2$ to $t_3$, the signal 0ZC has no change of state so that the second signal XOR_O is at the low state, resulting in the filtered signal FZC remaining unchanged. During the period $t_3$ to $t_4$, the signal 0ZC has changes of state so that the second signal XOR_O is at the high state and the multiplexer 908 accordingly selects the third signal NAND_O as its output. During this period, since the signal HZC is at the high state, the third signal NAND_O is at the low state and the filtered signal FZC is at the low state. During the period $t_4$ to $t_5$, the signal 0ZC has no change of state so that the second signal XOR_O is at the high state, resulting in the filtered signal FZC remaining unchanged. According to the same principle, the operations following the time $t_5$ are similar to the operations described above so that their details will not be described for the sake of brevity.

The invention disclosed above is in a simple structure including a zero crossing filter and a hysteresis zero crossing filter, resulting in a filtered signal without phase delay and glitch. It can be applied to any system that requires high speed signal conversion without phase delay and glitch. For instance, in the processing of the servo control signal of the DVD system, high speed signal conversion without phase delay and glitch is required for better system performance. Also, by varying the high and low threshold voltages of the hysteresis zero crossing filter, different protect window can be obtained for the requirement of the system.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for minimal phase delay and zero crossing filtering, receiving an input signal and a reference signal and outputting a filtered signal, the apparatus comprising:
    a zero crossing filter generating a zero-delay signal in response to the input signal and the reference signal;
    a hysteresis zero crossing filter generating a hysteresis signal in response to the input signal and the reference signal; and
    a phase-protect filter generating the filtered signal in response to the zero-delay signal and the hysteresis signal;
    wherein the zero-delay signal, the hysteresis signal, and the filtered signal are switched between a first state and a second state; the filtered signal is in the second state when the zero-delay signal has a change of state and the hysteresis signal is at the first state; the filtered signal is at the first state when the zero-delay signal has a change of state and the hysteresis signal is at the second state; and the filtered signal remains unchanged when the zero-delay signal has no change of state.

2. An apparatus according to claim 1, wherein the first state corresponds to a low level state.

3. An apparatus according to claim 1, wherein the second state corresponds to a high level state.

4. An apparatus according to claim 1, wherein the input signal is an analog signal.

5. An apparatus according to claim 1, wherein the filtered signal is a digital signal.

6. An apparatus according to claim 1, wherein the filtered signal has less glitch than the zero-delay signal.

7. An apparatus according to claim 1, wherein the filtered signal has less phase delay than the hysteresis signal.

8. A phase protect filter for receiving a zero-delay signal and a hysteresis signal and outputting a filtered signal, the phase protect filter comprising:
    a first register receiving the zero-delay signal and a system clock signal and outputting a first signal;
    an exclusive-OR circuit receiving the zero-delay signal and the first signal and outputting a second signal;
    a NAND circuit receiving the hysteresis signal and the second signal and outputting a third signal;
    a multiplexer receiving the second signal and the third signal and outputting a fourth signal; and
    a second register receiving the system clock signal and the fourth signal and outputting the filtered signal;
    wherein the filtered signal is fed back to the multiplexer and the multiplexer selects either the filtered signal or the third signal as the fourth signal according to the second signal.

9. A phase protect filter according to claim 8, wherein the multiplexer outputs the third signal when the second signal is at a high level state and the multiplexer outputs the filtered signal when the second signal is at a low level state.

10. A phase protect filter according to claim 8, wherein the first and second registers are D flip-flops.

11. An apparatus according to claim 8, wherein the filtered signal has less glitch than the zero-delay signal.

12. An apparatus according to claim 8, wherein the filtered signal has less phase delay than the hysteresis signal.

13. A method for minimal phase delay and zero crossing filtering, converting an input signal into a filtered signal, the method comprising the steps of:

(a) generating a zero-delay signal and a hysteresis signal, wherein the zero-delay signal, the hysteresis signal, and the filtered signal are switched between a first state and a second state; and (b) outputting the filtered signal according to the zero-delay signal and the hysteresis signal;

wherein the filtered signal is at the second state when the zero-delay signal has a change of state and the hysteresis signal is at the first state; the filtered signal is at the first state when the zero-delay signal has a change of state and the hysteresis signal is at the second state; and the filtered signal's state remains unchanged when the zero-delay signal has no change of state.

14. A method according to claim 13, wherein the first state corresponds to a low level state.

15. A method according to claim 13, wherein the second state corresponds to a high level state.

16. An apparatus according to claim 13, wherein the filtered signal has less glitch than the zero-delay signal.

17. An apparatus according to claim 13, wherein the filtered signal has less phase delay than the hysteresis signal.

* * * * *